United States Patent [19]

Kitabayashi et al.

[11] Patent Number: 5,384,681
[45] Date of Patent: Jan. 24, 1995

[54] ELECTROSTATIC CHUCK

[75] Inventors: Tetsuo Kitabayashi; Toshiya Watanabe, both of Kanagawa, Japan

[73] Assignee: Toto Ltd., Fukuoka, Japan

[21] Appl. No.: 24,626

[22] Filed: Mar. 1, 1993

[51] Int. Cl.[6] .......................................... H02N 13/00
[52] U.S. Cl. ....................................... 361/234; 279/128
[58] Field of Search ....................... 361/230, 233, 234; 279/128; 269/8, 903

[56] References Cited

U.S. PATENT DOCUMENTS

| | | | |
|---|---|---|---|
| 3,875,119 | 4/1975 | Aoki et al. | 260/75 T |
| 4,020,234 | 4/1977 | Gardner . | |
| 4,040,827 | 8/1977 | Hamaker et al. | 96/1 LY |
| 4,109,377 | 8/1978 | Blazick et al. . | |
| 4,292,261 | 9/1981 | Kotani et al. | 264/24 |
| 4,384,918 | 5/1983 | Abe | 361/234 |
| 4,480,284 | 10/1984 | Tojo et al. | 361/234 |
| 4,502,094 | 2/1985 | Lewin et al. | 361/234 |
| 4,554,611 | 11/1985 | Lewin | 361/234 |
| 4,591,574 | 5/1986 | Ando et al. . | |
| 4,645,218 | 2/1987 | Ooshio et al. | 361/234 |
| 4,652,318 | 3/1987 | Masuda et al. . | |
| 4,668,644 | 5/1987 | Filhol . | |
| 4,678,683 | 7/1987 | Pasco et al. . | |
| 4,692,836 | 9/1987 | Suzuki | 361/234 |
| 4,724,510 | 2/1988 | Wicker et al. | 361/234 |
| 4,735,926 | 4/1988 | Ando et al. . | |
| 5,104,834 | 4/1992 | Watanabe et al. . | |
| 5,151,845 | 9/1992 | Watanabe et al. | 361/234 |

FOREIGN PATENT DOCUMENTS

| | | |
|---|---|---|
| 57-148456 | 9/1982 | Japan . |
| 59-57446 | 4/1984 | Japan . |
| 62-94953 | 5/1987 | Japan . |
| 8803917 | 6/1908 | WIPO . |

OTHER PUBLICATIONS

Chemical Abstract, vol. 92, No. 6, Feb. 1980, p. 270, (Corresponding to JP-A-79 32,450, item 92:4627U.

*Primary Examiner*—Jeffrey A. Gaffin
*Attorney, Agent, or Firm*—Irving M. Weiner; Joseph P. Carrier; Pamela S. Burt

[57] ABSTRACT

An electrostatic chuck having an insulating layer comprising solid-solution grains comprised of alumina and a transition metal oxide having the structure of a corundum, and a glass component present in grain boundaries of the solid-solution grains. The transition metal oxide is a transition metal oxide capable of forming a solid solution with alumina, and preferably includes chromia ($Cr_2O_3$), whose crystal structure is similar to alumina, having the structure of a corundum. The electrostatic chuck can exhibit a stable electrostatic performance without regard to operating temperatures.

18 Claims, 6 Drawing Sheets $\delta$ : GAP WHEN ATTRACTED
d : INSULATING LAYER THICKNESS

ELECTROSTATIC CHUCK

BACKGROUND OF THE INVENTION

1. Field of the Invention

The present invention relates to an electrostatic chuck used to attractively fix articles such as semiconductor wafers by electrostatic force.

2. Description of Related Art

Electrostatic chucks provided with an internal electrode between a substrate and an insulating layer (dielectric layer) are used as wafer fixing jigs when semiconductor wafers are treated by plasma etching, CVD, ion plating or the like.

The electrostatic chucks are required to perform such that a great electrostatic force is produced during the application of voltage so that attracted articles are prevented from falling or moving and after elimination of the applied voltage the electrostatic attractive force is immediately made small so that the attracted articles can be displaced with ease.

Means for increasing electrostatic attractive force include, e.g., means in which the insulating layer is made to have a large dielectric constant (Japanese Patent Publications No. 60-59104 and No. 62-19060), means in which the thickness of the insulating layer is controlled (Japanese Patent Laid-open Publication No. 57-64950) and means in which the insulating layer is made to have a volume resistivity in a given range (Japanese Patent Publication No. 61-14660 and Japanese Patent Laid-open Publication No. 2-22166). Means for making the displacement of attracted articles easy include, e.g., means in which helium gas is blown between the chuck surface and an attracted article (Japanese Utility Model Laid-open Publication No. 2-120831) and means for applying a voltage with polarity opposite to the voltage applied when wafers are attracted (Japanese Patent Publication No. 2-63304).

The above conventional means for increasing electrostatic attractive force take note of only the insulating layer, where residual attractive force tends to become larger with an increase in electrostatic attractive force. With the conventional means, however, it takes as long as at least 60 seconds before the residual attractive force attenuates and the attracted article can be displaced with ease. Thus, with the conventional means it is not possible to have a response in which attracted articles may be displaced immediately after treatment. Hence, there is a disadvantage that an additional device or an additional operation other than those normally used must be added in order to make the displacement of attracted articles easy. In particular, there is a problem when the known electrostatic chucks are used in an environment of low temperature.

One reason for the above limitations of known electrostatic chucks is that the materials constituting the insulating layer (dielectric layer) of conventional electrostatic chucks do not allow the volume resistivity of the insulating layer to be arbitrarily controllable over a wide range. In this regard, it has been proposed to add titania to alumina as a transition metal oxide. In this instance, composite oxide grains deposited between alumina grains increase with an increase in the amount of titania added, resulting in a remarkable dependence of electrical conductivity on electric field intensity. Namely, the volume resistivity abruptly decreases at a certain electric field intensity that forms a border, making it impossible to maintain a given electrostatic performance.

SUMMARY OF THE INVENTION

To solve the above problem, an object of the present invention is to provide an electrostatic chuck that allows arbitrary control of the volume resistivity of the insulating layer over a wide range during its manufacture and hence can exhibit a stable electrostatic performance without regard to operating temperatures.

To achieve the above object, the electrostatic chuck according to the present invention has an insulating layer comprising the combination of solid-solution grains and a glass component present in grain boundaries of the solid-solution grains, or the combination of solid-solution grains, a glass component present in grain boundaries of the solid-solution grains and not more than 2% by weight of a transition metal oxide deposited in the grain boundaries of the solid-solution grains; the solid-solution grains comprising alumina and a transition metal oxide having the structure of a corundum.

The transition metal oxide herein used has the structure of a corundum. Since this corundum structure is similar to the crystal structure of alumina, the transition metal oxide can readily form a solid solution with alumina.

DESCRIPTION OF THE PREFERRED EMBODIMENTS

Preferred embodiments of the present invention will be described below with reference to the accompanying drawings.

Figure 1:
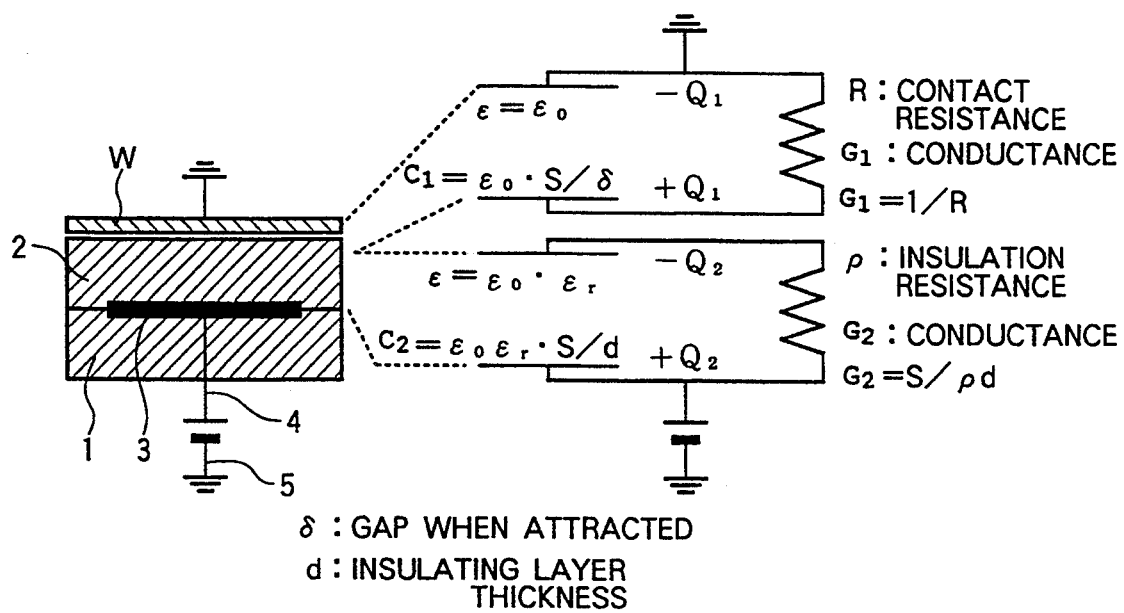
FIG. 1 depicts an electrostatic chuck and illustrates an equivalent circuit of the electrostatic chuck.

As shown in FIG. 1, the electrostatic chuck according to the present invention comprises a substrate 1, an insulating layer 2 formed thereon, an internal electrode 3 formed between the substrate 1 and the insulating layer 2. The electrode 3 is connected with a DC power source 5 through a lead wire 4 and a semiconductor wafer W is directly connected with a ground or electrically connected therewith by plasma.

Figure 2:
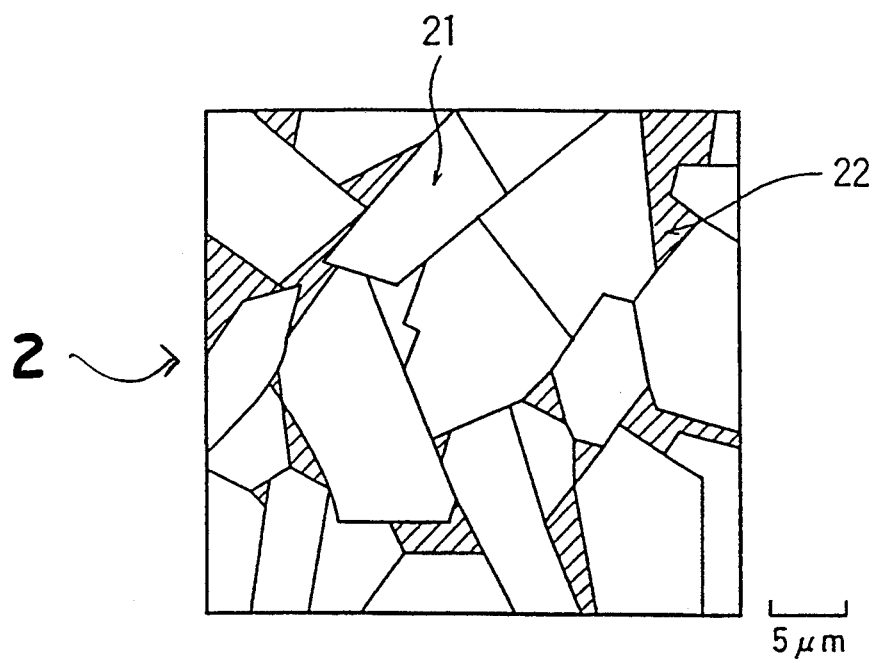
FIG. 2 is a partial enlarged diagrammatic view of an insulating layer.
Figure 3:
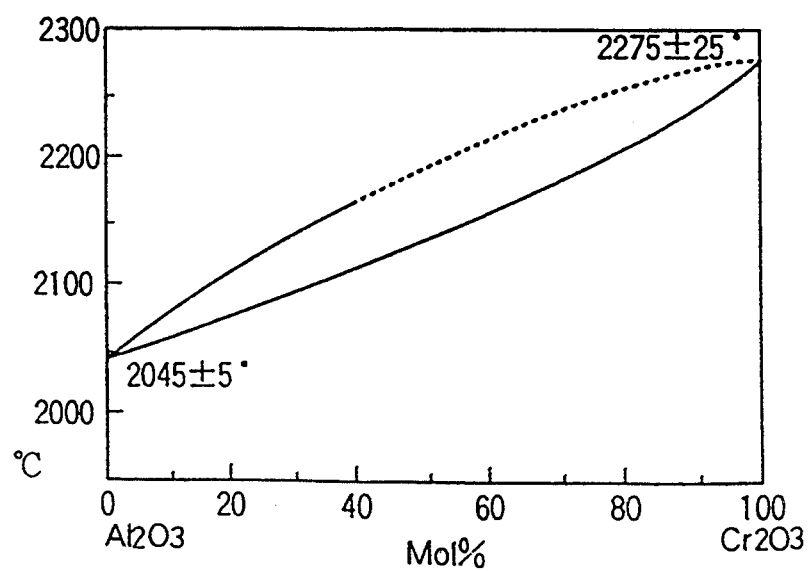
FIG. 3 shows the state of alumina($Al_2O_3$)-chromia($Cr_2O_3$) solid solution, and particularly shows the existence of the solid solution in relation to temperature and mol % of the two components.

As will be seen from FIG. 2, a partial enlarged diagrammatic view of the insulating layer, the insulating layer 2 comprises solid-solution grains 21 comprised of alumina and a transition metal oxide, and glass 22 present in grain boundaries of the solid-solution grains. Here, the transition metal oxide may preferably include those capable of forming a solid solution with alumina, specifically including chromia, $Ga_2O_3$, $Fe_2O_3$, $V_2O_3$, $Rh_2O_3$ and $Ti_2O_3$. Chromia ($Cr_2O_3$) is particularly preferred, which well assumes the crystal structure of a corundum, the crystal structure of which is similar to alumina. FIG. 3 shows the state of solid solution of alumina ($Al_2O_3$) and chromia ($Cr_2O_3$). As is seen from FIG. 3, a perfect solid solution is formed.

Now, on the basis of the electrostatic chuck shown in FIG. 1, comprising a substrate 1, an insulating layer 2 formed thereon, an internal electrode 3 formed between the substrate 1 and the insulating layer 2, where the electrode 3 is connected with a DC power source 5 through a lead wire 4 and a semiconductor wafer W is directly connected with a ground or electrically connected therewith by plasma, the present inventor has taken note of an equivalent circuit of this electrostatic chuck (as is shown in the right half side of FIG. 1), and has elucidated from the equivalent circuit the relationship between i) attenuation time $t_s$ (the time required for residual electrostatic force to attenuate by 98% with respect to saturated electrostatic force), ii) volume resistivity $\rho$ ($\Omega \cdot m$) of the insulating layer at operating temperatures of the electrostatic chuck, iii) dielectric constant $\epsilon_r$ of the insulating layer at operating temperatures of the electrostatic chuck, iv) distance d (m) between the internal electrode and the surface of the insulating layer i.e., thickness of the insulating layer, and (v) gap $\delta$ (m) between an attracted article and the surface of the insulating layer. This relationship is represented by the following expression.

$$t_s = 1.731 \times 10^{-11} \rho(\epsilon_r + d/\delta)$$

It is seen from the above expression that the attraction-displacement performance on attracted articles at operating temperatures of electrostatic chucks greatly depends on the volume resistivity of their insulating layer. In other words, in order to exhibit a stable electrostatic performance without regard to operating temperatures, the volume resistivity of the insulating layer must be arbitrarily controllable over a wide range when electrostatic chucks are manufactured.

Figure 4:
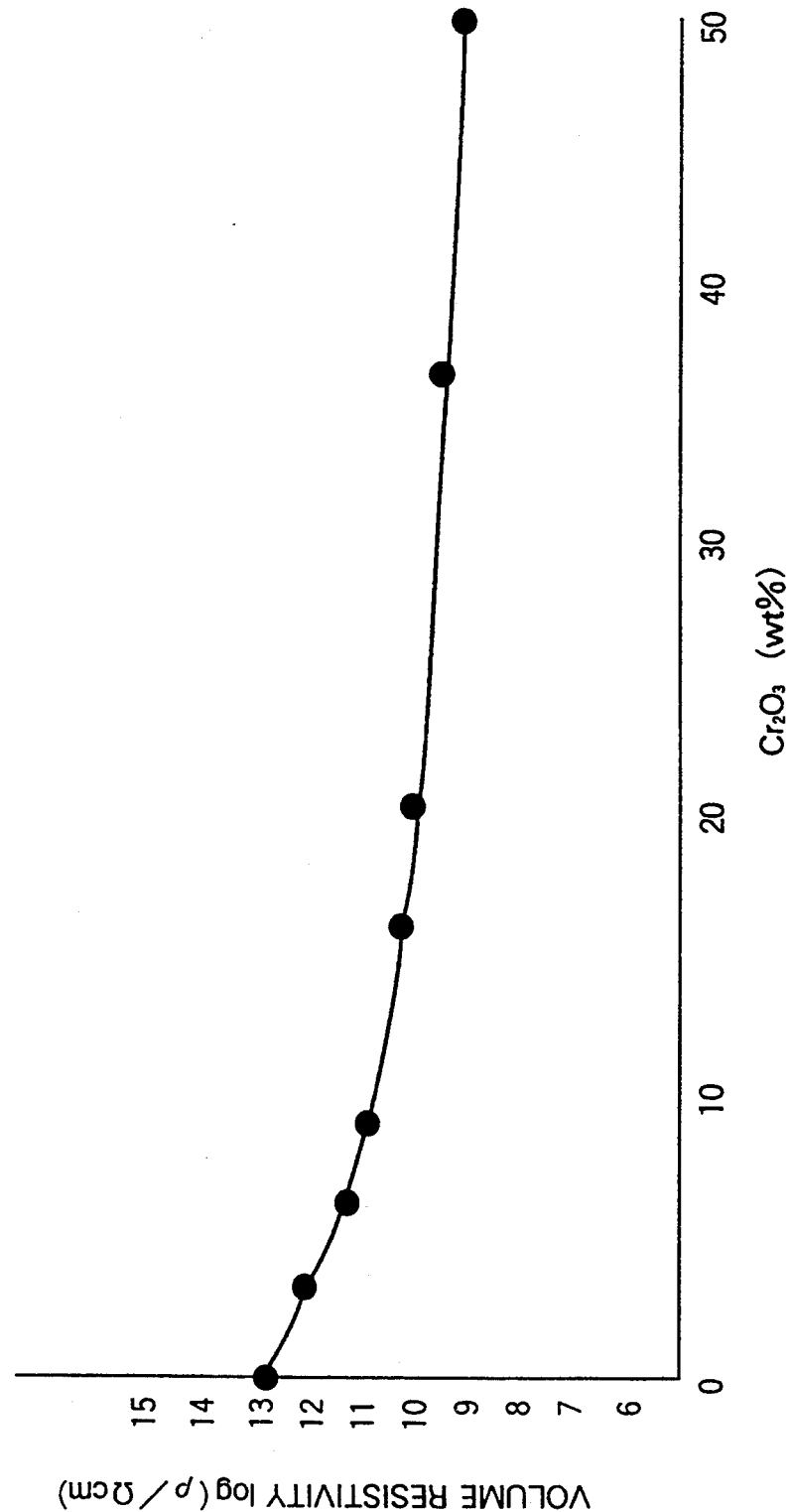
FIG. 4 is a graph showing the relationship between the proportion of chromia in the solid solution and its volume resistivity i.e., showing that the log of volume resistivity of the solid solution decreases at a relatively large rate as the wt % of chromia is increased from 0–10%, but decreases at a much lower rate as the wt % of chromia is further increased from 10–50%.

Alumina is presumed to have a volume resistivity of $10^{12}$ $\Omega \cdot m$ or more, and chromia a volume resistivity of $10^4$ $\Omega \cdot m$ or less. Besides, as stated above, alumina and chromia can be formed into a perfect solid solution. Hence, the volume resistivity of the insulating layer 2 can be controlled by changing the proportion of the chromia to be added. FIG. 4 is a graph showing the relationship between the proportion of chromia in the solid solution and its volume resistivity. As is seen from the graph, the volume resistivity of the insulating layer 2 can be arbitrarily controlled in a given range.

Figure 5:
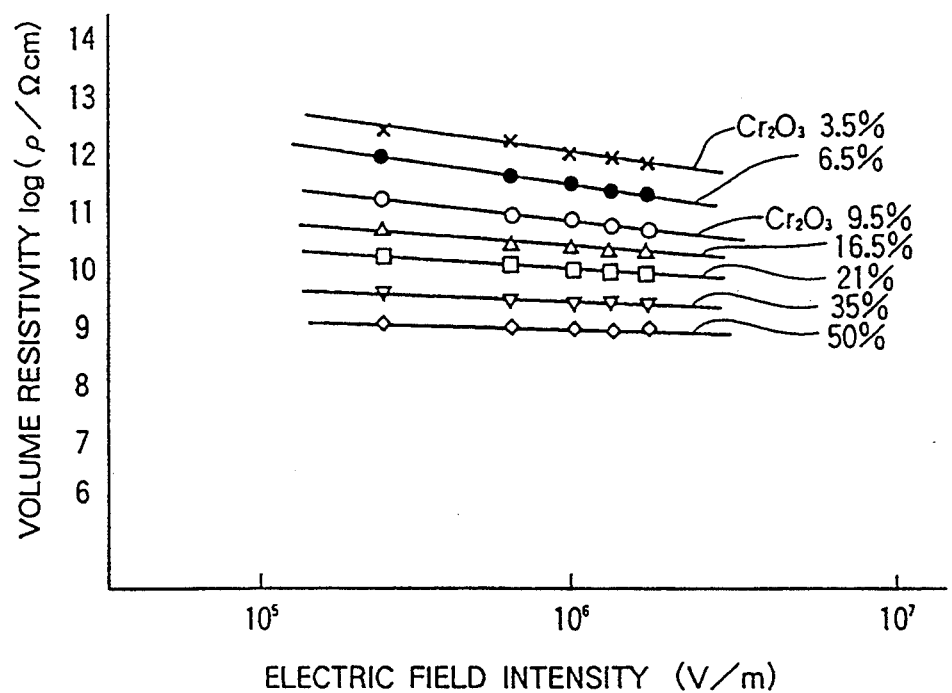
FIG. 5 is a graph showing the relationship between volume resistivity and electric field intensity.

In the insulating layer 2 having the structure as shown in FIG. 2, the solid-solution grains 21 have a lower resistivity than the grain boundary glass 22, so that electric charges are conducted through the solid-solution grains 21. In this conduction, as shown in FIG. 5, electric currents flow according to the Ohm's law even when the electric field intensity increases. Hence, no insulation failure occurs even with an abrupt increase in electric current, so that any damage to the silicon wafers can be prevented.

Figure 6:
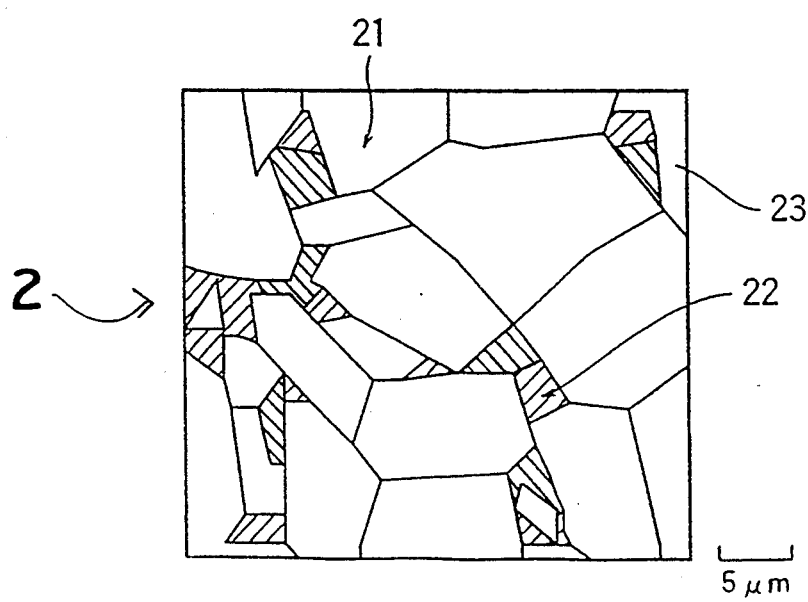
FIG. 6 is a partial enlarged diagrammatic view of an insulating layer according to another embodiment.

FIG. 6 is a partial enlarged diagrammatic view of an insulating layer according to another embodiment of the present invention. In this embodiment, the insulating layer 2 comprises solid-solution grains 21 comprised of alumina and chromia (the transition metal oxide having the structure of a corundum), glass 22 present in grain boundaries of the solid-solution grains, and deposits 23 of titania ($TiO_2$, a transition metal oxide having no corundum structure).

Figure 7:
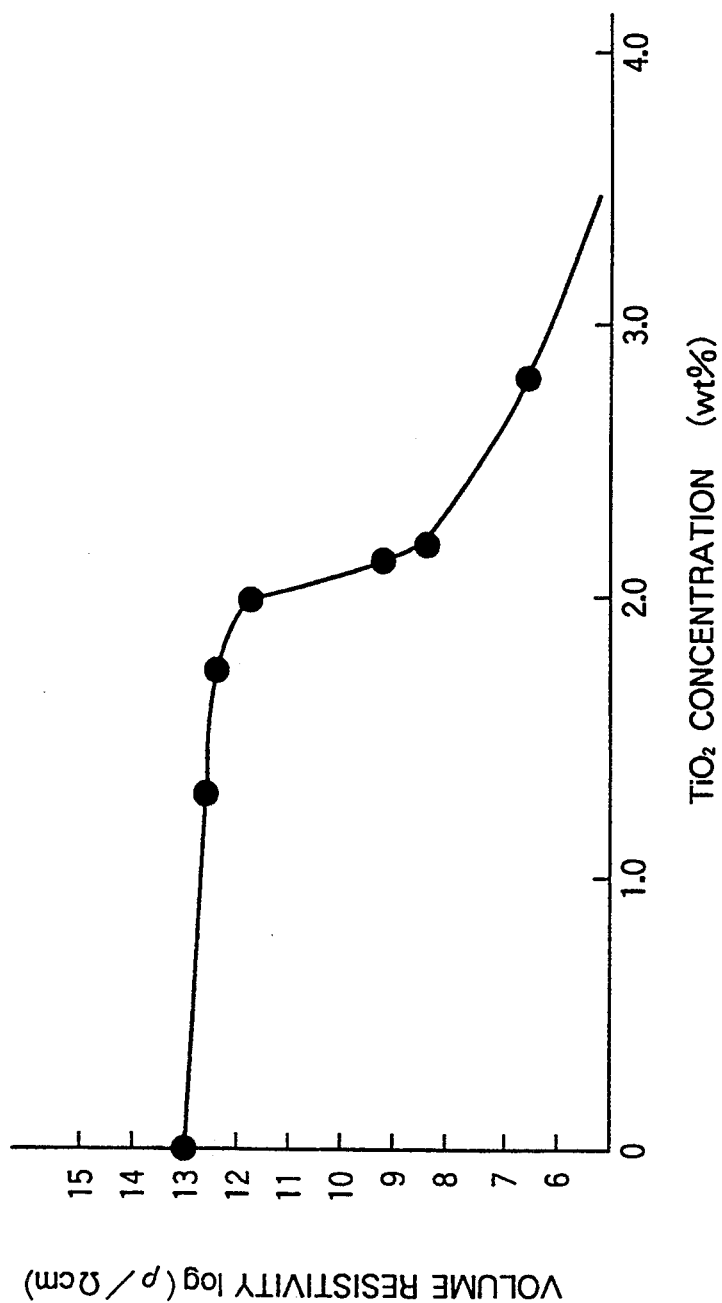
FIG. 7 is a graph showing the relationship between the concentration of titania ($TiO_2$) in the solid solution and volume resistivity of the solid solution, i.e., showing that the log of the volume resistivity of the solid solution is at a relatively high and minimally changing level as the concentration wt % of titania increases from 0–2%, but drops off very sharply and approaches a value of zero as the wt % of titania increases from 2–3.5%.
Figure 8:
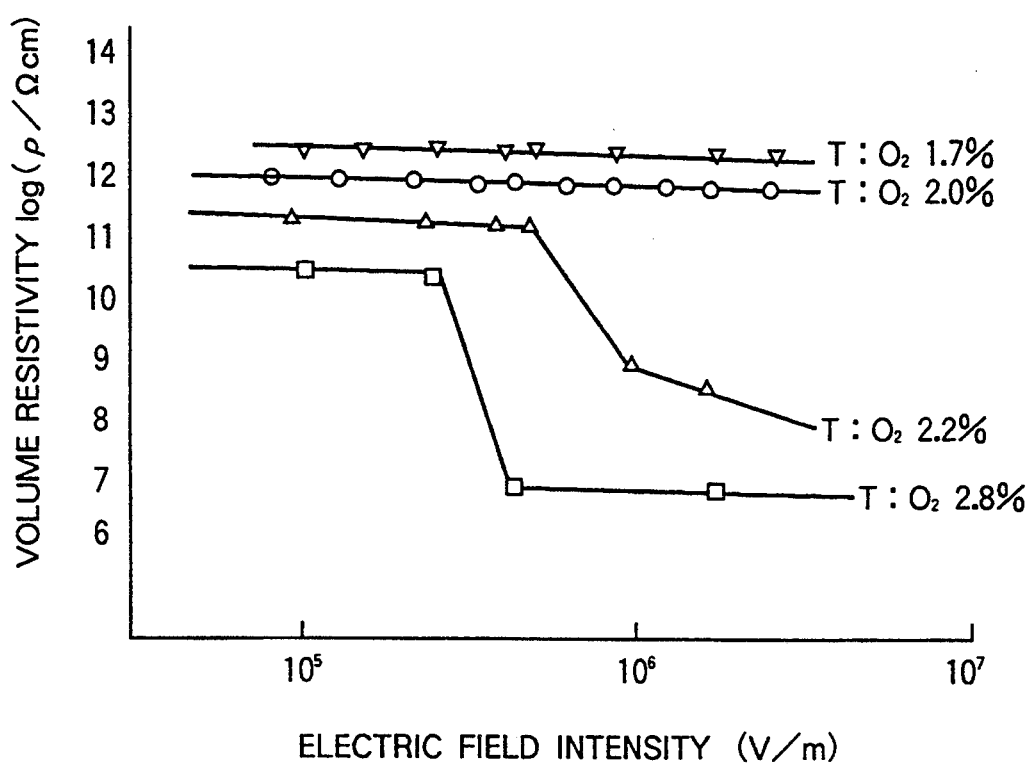
FIG. 8 is a graph showing the relationship between the concentration of titania ($TiO_2$), the volume resistivity of an insulator, and electric field intensity.

FIG. 7 is a graph showing the relationship between the concentration of titania ($TiO_2$) and volume resistivity. FIG. 8 is a graph showing the relationship between the concentration of titania ($TiO_2$), the volume resistivity of an insulator, and electric field intensity. As is seen from these graphs, it is difficult to control the volume resistivity within the range of from $10^6$ $\Omega \cdot m$ to $10^{10}$ $\Omega \cdot m$ unless the titania ($TiO_2$), when added, is in a concentration of 2% by weight or less. As shown in FIG. 8, when the concentration of titania is more than 2% by weight, there is a great dependence of volume resistivity on electric field intensity, which tends to cause insulation failure due to abrupt increase in electric current.

The electrostatic chuck according to the present invention can be manufactured in the manner described below. First, as starting materials, alumina powder and the transition metal oxide (chromia, $Cr_2O_3$) having the corundum structure, and also titania ($TiO_2$) and a sintering aid that forms the glass component in the final product are made ready for use. These are weighed and then mixed and pulverized using a ball mill. To the resulting powdery mixture, a binder such as polyvinyl butyral (PVB) and a solvent such as toluene, isopropyl alcohol or n-butanol are added, followed by deaeration, aging and molding to form a green sheet. The green sheet thus formed is laminated to an unfired substrate made of $Al_2O_3$ or the like (the same material as used in the insulating layer) on which an electrode layer comprised of tungsten, molybdenum or the like has been printed, followed by firing in a reducing atmosphere at about 1,500° C. to about 1,650° C. (usually at about 1,600° C.) for about 1 hour to about 7 hours (usually about 2 hours). Thus an electrostatic chuck can be obtained.

Here, the alumina may be added in an amount of from 41 to 91% by weight. The transition metal oxide having the corundum structure should be added in an amount of from 1% by weight to 50% by weight. The reason therefor is that its addition in an amount less than 1% by weight can not be effective and its addition in an amount more than 50% by weight makes it impossible to carry out satisfactory firing. As the sintering aid, silica sand, clay, glass frit, a carbonate or nitrate of an alkaline earth metal such as $MgCO_3$, $CaCO_3$, $SrCO_3$ or $BaCO_3$ may be used, which should be added in an amount of from 5% by weight to 12% by weight. The reason therefor is that its addition in an amount less than 5% by weight may result in a shrinkage of ceramics to cause a lowering of breakdown voltage, and its addition in an amount more than 12% by weight may result in the formation of a liquid layer at a low temperature to make it impossible to carry out satisfactory firing.

With regard to insulating layers of electrostatic chucks according to the present invention and conventional electrostatic chucks, their volume resistivity, attenuation time at various temperatures, and leak current were measured at an electric field intensity of $1.67 \times 10^6$ V/m.

Results obtained are shown in Table 1.

The electrostatic chucks used in the measurement were prepared by mixing and pulverizing alumina, chromia ($Cr_2O_3$) and titania ($TiO_2$) used in the amounts (% by weight) shown in Table 1 and 9% by weight, in terms of oxide, of MgO and CaO as sintering aids in a ball mill, and adding PVB as a binder and toluene and butyl acetate to the resulting powdery mixture, followed by deaeration, aging and molding to form a green sheet. The green sheet thus formed was laminated to a substrate made of $Al_2O_3$, having been similarly formed into a green sheet and on which an electrode layer comprised of tungsten had been printed, followed by firing in a reducing atmosphere of a hydrogen-nitrogen mixed gas at 1,600° C. for 2 hours).

during its manufacture and hence can exhibit a stable electrostatic performance without regard to operating temperatures.

Although there have been described what are at present considered to be the preferred embodiments of the invention, it will be understood by those skilled in the art that various changes and modifications can be made therein without departing from the spirit and scope of the invention, and accordingly all matters contained in the above description and illustrated in the accompanying drawings shall be interpreted to be illustrative and not in a limiting sense. The scope of the invention is indicated by the appended claims, rather by the foregoing description.

What is claimed is:

1. An electrastatic chuck comprising a substrate and formed thereon an internal electrode and an insulating layer, wherein said insulating layer comprises a solid-solution comprised of alumina and a transition metal oxide having the structure of a corundum.

2. The electrostatic chuck according to claim 1,

TABLE 1

| Sample No. | $Al_2O_3$ concentration (wt. %) | $Cr_2O_3$ concentration (wt. %) | $TiO_2$ concentration (wt. %) | Volume resistivity (room temp.) ($\Omega \cdot m$) | Attenuation time Room temp. (sec) | −50° C. (sec) | +200° C. (sec) | Leak current per 6 in. Room temp. (mA) | Remarks |
|---|---|---|---|---|---|---|---|---|---|
| 1 | 91 | 0 | 0 | $1.0 \times 10^{13}$ | >1,500 | >1,500 | 30 | <0.001 | X |
| 2 | 89.7 | 1.3 | 0 | $1.0 \times 10^{11}$ | 350 | >1,500 | <3 | 0.01 | Y |
| 3 | 87.5 | 3.5 | 0 | $1.5 \times 10^{10}$ | 55 | 400 | <3 | 0.1 | Y |
| 4 | 84.5 | 6.5 | 0 | $4.5 \times 10^9$ | 15 | 100 | <3 | 0.35 | Y |
| 5 | 81.5 | 9.5 | 0 | $1.8 \times 10^9$ | 5 | 40 | <3 | 0.81 | Y |
| 6 | 74.5 | 16.5 | 0 | $9.0 \times 10^8$ | 3 | 20 | <3 | 1.7 | Y |
| 7 | 70 | 21 | 0 | $3.0 \times 10^8$ | <3 | 8 | <3 | 5.1 | Y |
| 8 | 55 | 36 | 0 | $1.0 \times 10^8$ | <3 | 6 | <3 | 15.1 | Y |
| 9 | 41 | 50 | 0 | $3.0 \times 10^7$ | <3 | 4 | <3 | 49 | Y |
| 10 | 89.7 | 0 | 1.3 | $5.0 \times 10^{10}$ | 117 | 1,500 | <3 | 0.03 | X |
| 11 | 88.7 | 1 | 1.3 | $1.0 \times 10^{10}$ | 25 | 300 | <3 | 0.2 | Y |
| 12 | 86.2 | 3.5 | 1.3 | $5.0 \times 10^9$ | 15 | 150 | <3 | 0.31 | Y |
| 13 | 83.2 | 6.5 | 1.3 | $1.5 \times 10^9$ | 10 | 40 | <3 | 0.99 | Y |
| 14 | 80.2 | 9.5 | 1.3 | $6.0 \times 10^8$ | 4.5 | 15 | <3 | 2.46 | Y |
| 15 | 73.2 | 16.5 | 1.3 | $3.0 \times 10^8$ | <3 | 7 | <3 | 5.1 | Y |
| 16 | 68.7 | 21 | 1.3 | $1.0 \times 10^8$ | <3 | 3 | <3 | 14.8 | Y |
| 17 | 53.7 | 38 | 1.3 | $3.0 \times 10^7$ | <3 | <3 | <3 | 49.1 | Y |
| 18 | 39.7 | 50 | 1.3 | $1.0 \times 10^7$ | <3 | <3 | <3 | 155 | Y |
| 19 | 89.3 | 0 | 1.7 | $4.0 \times 10^{10}$ | 130 | 1,000 | <3 | 0.04 | X |
| 20 | 85.8 | 3.5 | 1.7 | $4.0 \times 10^9$ | 15 | 100 | <3 | 0.42 | Y |
| 21 | 82.8 | 6.5 | 1.7 | $1.2 \times 10^9$ | 4 | 30 | <3 | 1.3 | Y |
| 22 | 79.8 | 9.5 | 1.7 | $4.8 \times 10^8$ | <3 | 15 | <3 | 3.1 | Y |
| 23 | 88.8 | 0 | 2.2 | $2.5 \times 10^6$ | <3 | <3 | <3 | 601 | X |
| 24 | 85.3 | 3.5 | 2.2 | $2.2 \times 10^6$ | <3 | <3 | <3 | 670 | X |
| 25 | 82.3 | 6.5 | 2.2 | $1.5 \times 10^6$ | <3 | <3 | <3 | 980 | X |
| 26 | 79.3 | 9.5 | 2.2 | $1.0 \times 10^6$ | <3 | <3 | <3 | >1,000 | X |
| 27 | 88.2 | 0 | 2.8 | $3.0 \times 10^4$ | <3 | <3 | <3 | >1,000 | X |
| 28 | 84.7 | 3.5 | 2.8 | $2.5 \times 10^4$ | <3 | <3 | <3 | >1,000 | X |
| 29 | 81.7 | 6.5 | 2.8 | $2.0 \times 10^4$ | <3 | <3 | <3 | >1,000 | X |
| 30 | 78.7 | 9.5 | 2.8 | $2.0 \times 10^4$ | <3 | <3 | <3 | >1,000 | X |

X: Comparative Example
Y: Present Invention

As is seen from Table 1, since the electrostatic chucks according to the present invention have an insulating layer comprising i) solid-solution grains comprised of alumina and a transition metal oxide having the structure of a corundum, and a glass component present in grain boundaries of the solid-solution grains, or ii) solid-solution grains comprised of alumina and a transition metal oxide having the structure of a corundum, a glass component present in grain boundaries of the solid-solution grains and not more than 2% by weight of a transition metal oxide deposited in the grain boundaries of the solid-solution grains, it is possible to obtain an electrostatic chuck that allows arbitrary control of the volume resistivity of the insulating layer over a wide range wherein said insulating layer further comprises a glass component.

3. The electrostatic chuck according to claim 2, wherein said transition metal oxide having the structure of a corundum is chromia $Cr_2O_3$.

4. The electrostatic chuck according to claim 3, wherein said insulating layer has a volume resistivity of not higher than $10^{11}$ $\Omega \cdot m$.

5. The electrostatic chuck according to claim 2, wherein said insulating layer has a volume resistivity of not higher than $10^{11}$ $\Omega \cdot m$.

6. The electrostatic chuck according to claim 1, wherein said insulating layer further comprises a glass component and not more than 2% by weight of another transition metal oxide.

7. The electrostatic chuck according to claim 6, wherein said another transition metal oxide is titania $TiO_2$.

8. The electrostatic chuck according to claim 7, wherein said insulating layer has a volume resistivity of not higher than $10^{11}$ Ω·m.

9. The electrostatic chuck according to claim 6, wherein said another transition metal oxide is present in grain boundaries of the solid solution.

10. The electrostatic chuck according to claim 9, wherein said insulating layer has a volume resistivity of not higher than $10^{11}$ Ω·m.

11. The electrostatic chuck according to claim 6, wherein said transition metal oxide having the structure of a corundum is chromia $Cr_2O_3$.

12. The electrostatic chuck according to claim 11, wherein said insulating layer has a volume resistivity of not higher than $10^{11}$ Ω·m.

13. The electrostatic chuck according to claim 3, wherein said insulating layer has a volume resistivity of not higher than $10^{11}$ Ω·m.

14. The electrostatic chuck according to claim 1, wherein said transition metal oxide having the structure of a corundum is chromia $Cr_2O_3$.

15. The electrostatic chuck according to claim 14, wherein said insulating layer has a volume resistivity of not higher than $10^{11}$ Ω·m.

16. The electrostatic chuck according to claim 1, wherein said insulating layer has a volume resistivity of not higher than $10^{11}$ Ω·m.

17. An electrostatic chuck, comprising:
a substrate;
an insulating layer; and
an internal electrode disposed between said substrate and said insulating layer;
said insulating layer exhibits a stable volume resistivity over a temperature range of $-50°$ C.–$200°$ C. and at an electrical field intensity of at least $10^5$ V/m.

18. An electrostatic chuck according to claim 17, wherein said insulating layer comprises a solid-solution comprised of alumina and a transition metal oxide having the structure of a corundum.

* * * * *

UNITED STATES PATENT AND TRADEMARK OFFICE
CERTIFICATE OF CORRECTION

PATENT NO. : 5,384,681
DATED : January 24, 1995
INVENTOR(S) : Kitabayashi et al.

It is certified that error appears in the above-indentified patent and that said Letters Patent is hereby corrected as shown below:

Column 1, line 16, after "great electrostatic" insert --attractive--.

Signed and Sealed this

Twenty-first Day of March, 1995

Attest:

BRUCE LEHMAN

Attesting Officer      Commissioner of Patents and Trademarks